(12) United States Patent
Liu et al.

(10) Patent No.: US 6,255,164 B1
(45) Date of Patent: Jul. 3, 2001

(54) EPROM CELL STRUCTURE AND A METHOD FOR FORMING THE EPROM CELL STRUCTURE

(75) Inventors: Chia-Chen Liu; Ling-Sung Wang, both of Hsinchu (TW)

(73) Assignee: Worldwide Semiconductor Manufacturing Corp. (TW)

( * ) Notice: Subject to any disclaimer, the term of this patent is extended or adjusted under 35 U.S.C. 154(b) by 0 days.

(21) Appl. No.: 09/365,732

(22) Filed: Aug. 3, 1999

(51) Int. Cl.[7] ............................................... H01L 21/8247
(52) U.S. Cl. ............................................ 438/257; 438/261
(58) Field of Search ........................................ 438/257–267

(56) References Cited

U.S. PATENT DOCUMENTS

| | | | |
|---|---|---|---|
| 5,270,240 | * | 12/1993 | Lee . |
| 5,519,239 | * | 5/1996 | Chu ...................................... 257/314 |
| 5,589,413 | * | 12/1996 | Sung et al. . |
| 5,631,179 | * | 5/1997 | Sung et al. .......................... 438/264 |
| 5,741,719 | * | 4/1998 | Kim . |
| 5,856,223 | * | 1/1999 | Wang .................................. 438/264 |
| 6,017,796 | * | 1/2000 | Chen et al. .......................... 438/264 |
| 6,037,223 | * | 3/2000 | Su et al. .............................. 438/257 |
| 6,074,915 | * | 6/2000 | Chen et al. .......................... 438/258 |

\* cited by examiner

Primary Examiner—Richard Booth

(57) ABSTRACT

The present invention provides a cell structure of an electrically programmable read only memory (EPROM) which includes an EPROM gate structure, a source junction region, a drain junction region, a first dielectric layer, a self-aligned common source line, a self-aligned drain contact, a second dielectric layer, and a conductive line. The EPROM gate structure is on a portion of the substrate. The source junction region is in the substrate located on a first lateral side, namely the left side in the figure, of the EPROM gate structure. The drain junction region is in the substrate located on a second lateral side, namely the right side in the figure, of the EPROM gate structure. The first dielectric layer covers on top and sidewalls of the EPROM gate structure. The self-aligned common source line neighbors the first dielectric layer and is above the substrate on a portion of the source junction region. The self-aligned drain contact neighbors the first dielectric layer, and is above the substrate on a portion of the drain junction region. The second dielectric layer covers the first dielectric layer, the self-aligned common source line, and the self-aligned drain contact. The conductive line is on the second dielectric layer and communicates to the self-aligned drain contact.

10 Claims, 4 Drawing Sheets

EPROM CELL STRUCTURE AND A METHOD FOR FORMING THE EPROM CELL STRUCTURE

FIELD OF THE INVENTION

The present invention relates to semiconductor memory devices and semiconductor fabrication processes, and more specifically to an electrically programmable read only memory (EPROM) cell structure and a method of forming the electrically programmable read only memory (EPROM) cell structure.

BACKGROUND OF THE INVENTION

Memory devices are one of the most important devices for storing of data and information. By storing data electrically in the memory devices, the data can be accessed with ultra high speed for various applications. The progress in memory device fabrication technology has made memories become a highly reliable and valuable device for a great amount of data reading and data writing access within an extremely short time. Various types of memories have been developed for a variety of applications like computation and communications systems.

An ideal storage device must have several characteristics. Numerous important applications of memory devices are specified with highly reliable and high speed operations. Low cost is needed for the explosively increasing demand on the more storage capability with a great number of storage units. High performance and high density are both important factors for performing reliable and high speed operations with least volume needed for the storage devices. Low power dissipation are highly demanded for providing longer operation time or greener operations especially for portable devices with limited capacity of power supply. Non-volatile or least refreshing characteristics is needed for both reliable, safety, and low power data storage.

In the category of non-volatile memories, the electrically programmable read only memory (EPROM) has become one of the important applications. An electrically programmable read only memory (EPROM) device is a non-volatile memory integrated circuit which is employed to store a bit of binary data in each cell. As a non-volatile memory, an EPROM cell can keep the status of the stored data without the need of continuing power supply for refreshing. That is, upon reapplying power, the originally-stored data is retained and the stored information can be read out without loss.

In addition to its data retention capability, an EPROM can also be programmed to store new binary data. In a conventional EPROM device, reprogramming is accomplished by first exposing the EPROM to an ultra-violet (UV) light source in order to erase the old binary data. A UV-transparent lid on the packaged EPROM chip allows this erasure to occur. Following erasure, the new binary data is written into the EPROM by deactivating the chip select line and switching the EPROM's data outputs to inputs. The EPROM address inputs are then set to a starting value, the desired data is connected to the data inputs and the data is written into the EPROM cell identified by the address inputs. The address inputs are then incremented and the cycle is repeated for each cell in the EPROM array.

In an EPROM read operation, the binary data stored in the cell identified at the address inputs is connected to the chip's data output buffers. If the EPROM's chip select signal is activated, then the binary data from the selected cell is provided to the data bus.

ETOX (EPROM with Tunnel OXide) is a commonly applied cell structure for conventional EPROM devices. However, in the conventional ETOX base cell layout, there are many process limitations on the shrinking of the cell size. The limitation on accuracy and process window of present stage photo-lithography has limited the design of the ETOX cell layout. The layout design of the cell needs ertain design rules to have sufficient process window and acceptable product yield or the industrial mass fabrication.

Referring to FIG. 1, a schematic layout illustration of a portion of ETOX cells on integrated circuits is shown. The contact-to-polysilicon design rule A, namely the distance between a word line 2 of polysilicon and a contact 4, is required to keep large enough for avoiding undesired short connection or leakage path under possible process shift or misalignment of patterning processes. The polysilicon-to-field-oxide design rule B, namely the distance between the word line 2 of polysilicon and the field oxide region 6 for forming common source lines (Vss lines), should be large enough for the same reason.

Therefore, under the process window limitation, the cell has to provide additional but non-functional area for the fabrication yield. The cell size of each ETOX cell on integrated circuits, which is of vital concern in making high density EPROM devices and chips, is thus increased. The cell size reduction is hard to achieve under aforementioned process concern and design rule limitation. A more dense cell layout design for making high density EPROM chips will generally tighten the process window and damage the yield and reliability of fabricated products.

SUMMARY OF THE INVENTION

The present invention propose an electrically programmable read only memory (EPROM) cell structure. Having the self-aligned approach in the provided structure and the method of forming the electrically programmable read only memory (EPROM), the conventional design rule limitation on the EPROM cell layout is eliminated.

The method for forming an electrically programmable read only memory (EPROM) cell on a semiconductor substrate mainly includes the following steps. At first, a gate insulator layer is formed on the substrate and a first conductive layer is formed on the gate insulator layer. An inter-gate dielectric layer is formed on the first conductive layer and a second conductive layer is formed on the inter-gate dielectric layer. A cap dielectric layer is formed on the second conductive layer, and the cap dielectric layer, the second conductive layer, the inter-gate dielectric layer, the first conductive layer, and the gate insulator layer are patterned to form EPROM gate structures.

Next, sidewall dielectrics are formed on the sidewalls of the EPROM gate structures, and source junctions and drain junctions are formed in the substrate under regions between the EPROM gate structures which are uncovered by the EPROM gate structures. Third conductive structures are then formed on the substrate within the sidewall dielectrics, wherein the third conductive structures respectively communicates to the source junctions and the drain junctions.

In the preferred embodiments, a series of steps can be further added for making electrical connections to the cell structure of EPROM. At first, an inter-layer dielectric layer is formed over the substrate covering the EPROM gate structures and the third conductive structures. A portion of the inter-layer dielectric layer is removed to define contact openings to a portion of the third conductive structures, and an interconnection layer is formed on the inter-layer dielectric and within the contact openings in order to electrically couple with the portion of the third conductive structures.

The present invention provides a cell structure of an electrically programmable read only memory (EPROM) which includes an EPROM gate structure, a source junction region, a drain junction region, a first dielectric layer, a self-aligned common source line, a self-aligned drain contact, a second dielectric layer, and a conductive line.

The EPROM gate structure is on a portion of the substrate. The source junction region is in the substrate located on a first lateral side, namely the left side in the figure, of the EPROM gate structure. The drain junction region is in the substrate located on a second lateral side, namely the right side in the figure, of the EPROM gate structure. The first dielectric layer covers on top and sidewalls of the EPROM gate structure. The self-aligned common source line neighbors the first dielectric layer and is above the substrate on a portion of the source junction region. The self-aligned drain contact neighbors the first dielectric layer, and is above the substrate on a portion of the drain junction region. The second dielectric layer covers the first dielectric layer, the self-aligned common source line, and the self-aligned drain contact. The conductive line is on the second dielectric layer and communicates to the self-aligned drain contact.

In the preferred embodiments, the EPROM gate structure includes: a gate oxide layer on the portion of the substrate, a floating gate on the gate oxide layer, an inter-gate dielectric on the floating gate, and a control gate on the inter-gate dielectric.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings as follows.

DETAILED DESCRIPTION OF THE PREFERRED EMBODIMENT

The method for forming an electrically programmable read only memory (EPROM) cell in the present invention is illustrated with the following steps in the preferred embodiments.

Figure 1:
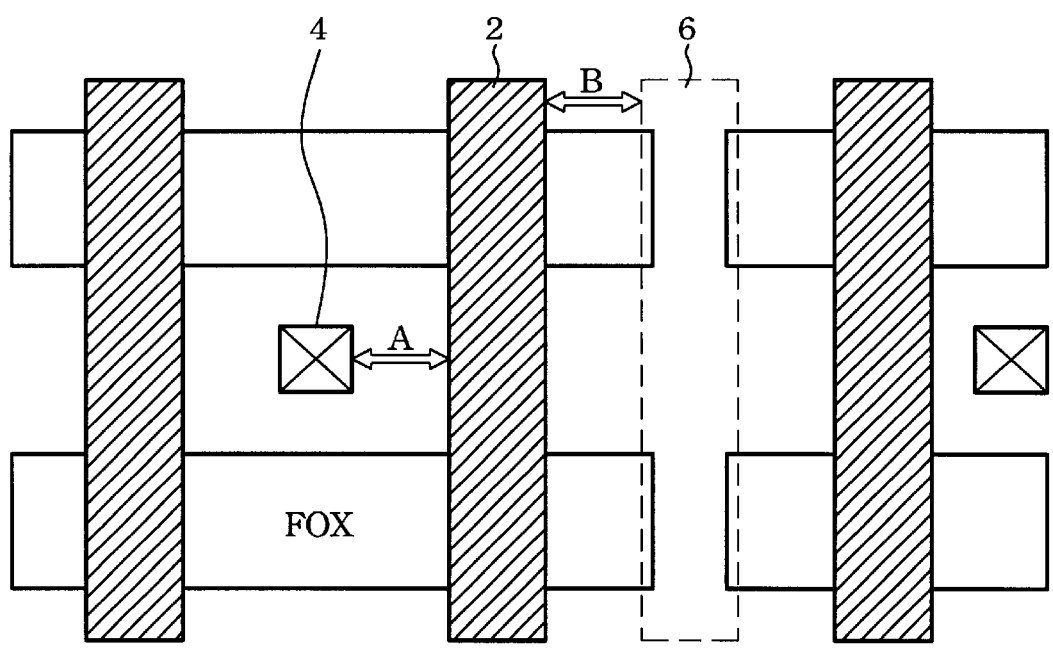
FIG. 1 illustrates a top view of a schematic layout illustration of a portion of ETOX cells on integrated circuits in the prior art.
Figure 2:
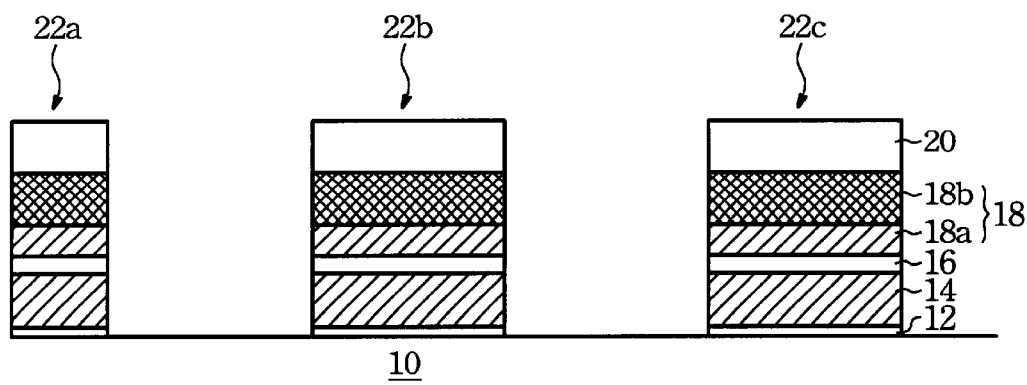
FIG. 2 illustrates a cross sectional view of forming and patterning a first conductive layer, an inter-gate dielectric layer, a second conductive layer, a cap dielectric layer, in order to form EPROM gate structures in accordance with the present invention.

Referring to FIG. 2, a semiconductor substrate 10 is illustrated in a cross sectional view. A single crystalline silicon in a <100> direction is utilized preferably as the semiconductor substrate 10. Depending on different device and process specifications, other materials with different crystalline directions can also be employed alternatively as the semiconductor substrate 10.

At first, a gate insulator layer 12 is formed on the substrate. In the preferred embodiments, the gate insulator layer 12 is a silicon oxide layer which is grown thermally from the semiconductor substrate 10. In general, the silicon oxide layer is thermally grown in an oxygen containing ambient from the semiconductor substrate 10, as an example, with a thickness of about 30 angstroms to 300 angstroms, in order to serve as a gate oxide layer.

A first conductive layer 14 is then formed on the gate insulator layer 12. The first conductive layer 14 is a polysilicon layer, or preferably a doped polysilicon layer in the case, and can be formed by chemical vapor deposition. As what is well known in the art, the doped polysilicon layer 14 can be formed by an in-situ doped chemical vapor deposition. Following the formation of the first conductive layer 14, an inter-gate dielectric layer 16 is formed on the first conductive layer 14. In the preferred embodiments, the inter-gate dielectric layer 16 is a tri-layer structure of a first silicon oxide layer, a silicon nitride layer, and a second silicon oxide layer. The stacked three layer structure formed by deposition generally provides improved dielectric characteristics between the floating gate and the control gate of the EPROM device.

A second conductive layer 18 is then formed on the inter-gate dielectric layer 16. The second conductive layer 18 is composed of either a single conductive layer or a composite conductive structure. In the preferred embodiments, the second conductive layer 18 includes a polysilicon layer 18a and a metal silicide layer 18b. The second conductive layer 18 is formed by depositing a second polysilicon layer 18a with a chemical vapor deposition on the inter-gate dielectric layer 16, and forming a metal silicide layer 18b, or preferably a tungsten silicide layer, on the second polysilicon layer 18a. Next, a cap dielectric layer 20 is formed on the second conductive layer 18. The cap dielectric layer 20 is preferably a silicon oxide layer in the case to serve as a top insulation layer for forming individual gate structures.

The composite layer structure as formed, including the cap dielectric layer 20, the second conductive layer 18, the inter-gate dielectric layer 16, the first conductive layer 14, and the gate insulator layer 12 are then patterned to form EPROM gate structures, such as gate structures 22a, 22b and 22c illustrated in FIGRUE 2. Typical pattering process can be employed to form the gate structures 22a, 22b and 22c. A lithography process is performed first to define the specified location and a series of etching process like an isotropic etching, or more specifically a plasma etching or a reactive ion etching (RIE) is applied then to define the gate structures 22a, 22b and 22c. For the second conductive layer 18 of control gate and the first conductive layer 14 of floating gate, the layout patterns are generally different and the two layers can be patterned at different process steps and timings with different pattern.

Figure 3:
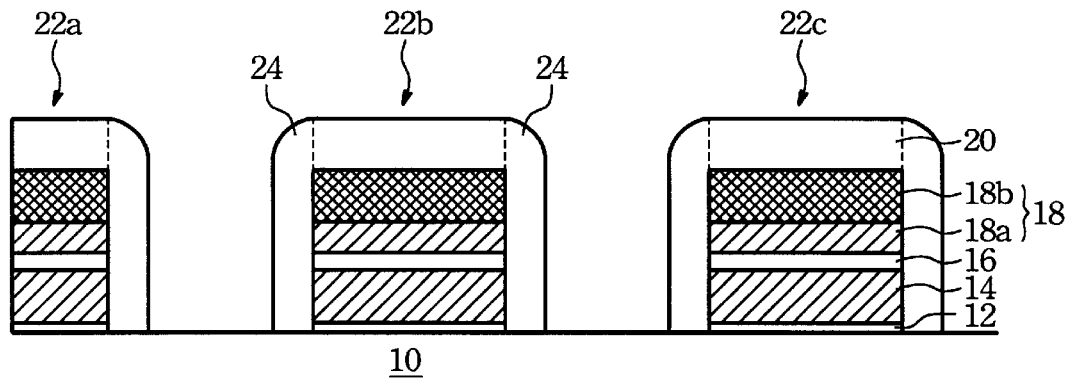
FIG. 3 illustrates a cross sectional view of forming sidewall dielectrics on sidewalls of the EPROM gate structures in accordance with the present invention.

Turning to FIG. 3, sidewall dielectrics 24 are then formed on sidewalls of the EPROM gate structures 22a, 22b and 22c. The sidewall dielectrics 24 are silicon oxide spacers in the case. The silicon oxide spacers can be formed by sequentially depositing and etching-back a silicon oxide layer.

Figure 4:
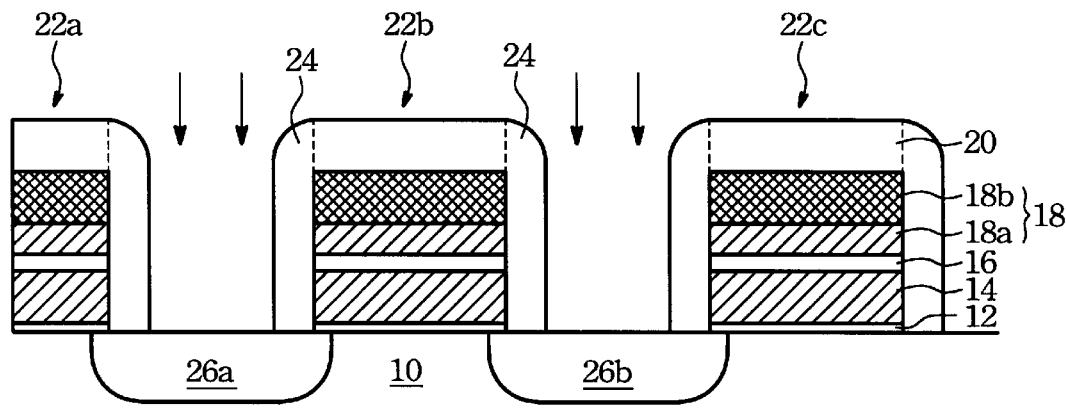
FIG. 4 illustrates a cross sectional view of forming source junctions and drain junctions in the substrate under regions between the EPROM gate structures in accordance with the present invention.

Referring to FIG. 4, using the sidewall dielectrics 24 and the gate structures 22a, 22b and 22c as a mask, source and drain junctions 26a and 26b are formed in the substrate 10. In the preferred embodiments, the source and drain junctions 26a and 26b can be formed by a typical ion implantation process with specified dopants, such as n-type dopants of arsenic or phosphorus. The source and drain junctions 26a and 26b are formed under the regions between the EPROM gate structures 22a, 22b and 22c, namely in the regions which are uncovered by the EPROM gate structures 22a, 22b and 22c with their sidewall spacers 24.

Figure 7:
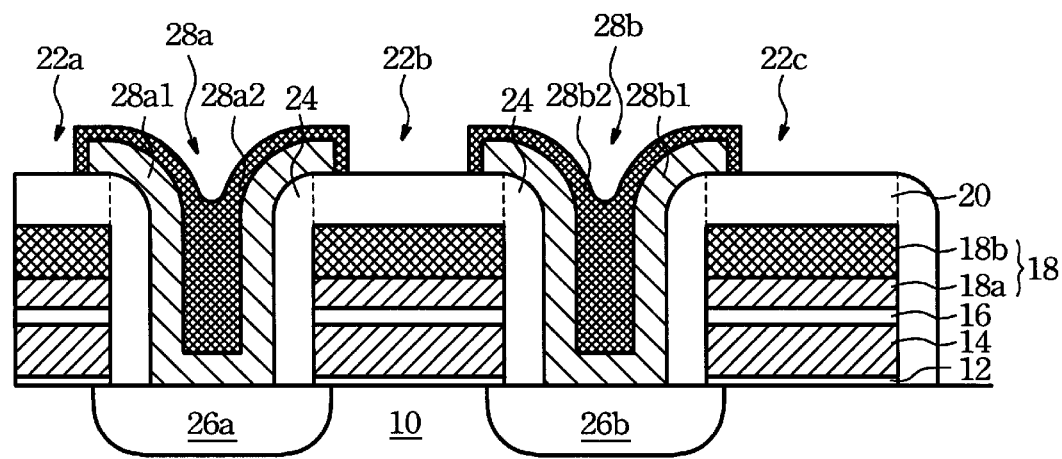
FIG. 7 illustrates a cross sectional view of forming third conductive structures on the substrate within the sidewall dielectrics, by reacting the third polysilicon layer and the metal layer in accordance with the present invention.

Turning to FIG. 7, third conductive structures 28a and 28b are formed on the substrate 10 within the sidewall dielectrics 24. The third conductive structures 28a and 28b are composed of either a single conductive layer or a composite conductive structure. In the preferred embodiments, the third conductive structures 28a and 28b include a polysilicon layer 28a1 and 28b1, and a metal silicide layer 28b1 and 28b2.

Figure 5:
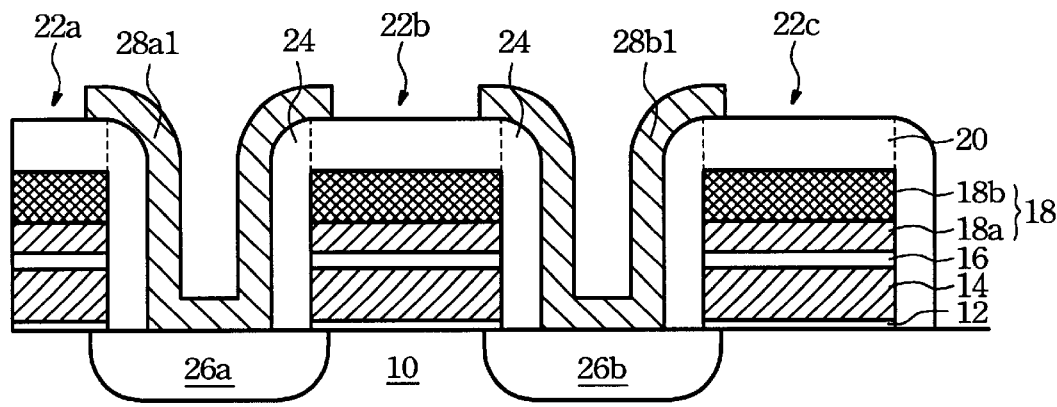
FIG. 5 illustrates a cross sectional view of forming and patterning a third polysilicon layer in accordance with the present invention.

Turning to FIG. 5, the polysilicon layer 28a1 and 28b1 cover conformably on the side and bottom walls in the space between the EPROM gate structures 22a, 22b and 22c, and also respectively communicates to the source junctions 26a and the drain junctions 26b. The formation of the polysilicon layer 28a1 and 28b1 includes the step of: forming a third polysilicon layer over the substrate 10 to conformably cover on the dielectric sidewalls 24, the source junctions 26a, the drain junctions 28b, and the cap dielectric layer 20; and removing portions of the third polysilicon layer to leave the remained third polysilicon layer 28a1 and 28b1 on the dielectric sidewalls 24, the source junctions 26a, and the drain junctions 26b.

Figure 6:
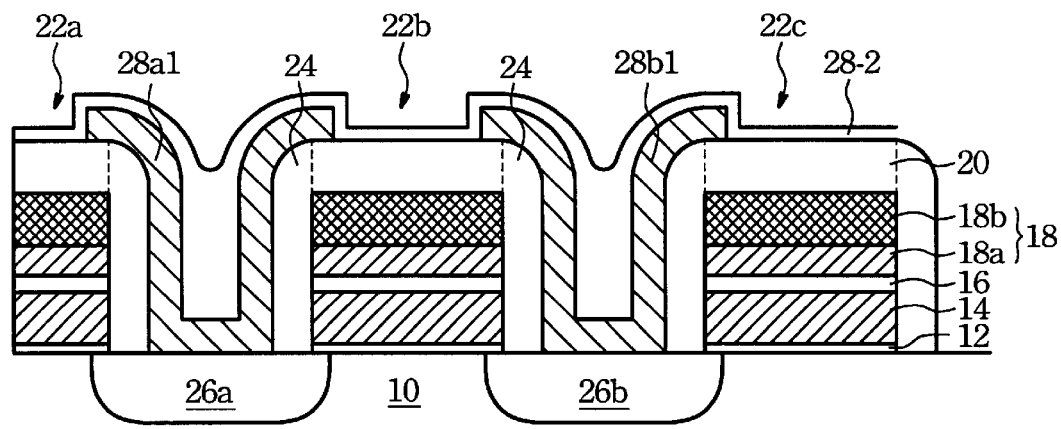
FIG. 6 illustrates a cross sectional view of forming a metal layer on the third polysilicon layer in accordance with the present invention.

Turning to FIG. 6, a metal or metal-containing layer, containing materials such as noble or refractory metals of titanium, titanium nitride, tungsten, cobalt, platinum, nickel, and chromium, is then formed on the polysilicon layer 28a1 and 28b1. After performing the steps of a first thermal anneal to react the polysilicon and metal, an unreacted metal removal, and a second thermal anneal to stabilize the reacted metal silicide, the self-aligned metal silicide layer 28a2 and 28b2 are formed on the regions having exposed silicon surface of the polysilicon layer 28a1 and 28b1, as shown in FIG. 7.

Therefore, having the formation of a conductive pad on the source junctions 26a and the drain junctions 26b, the third conductive structure 28a serves as a conductive source line (Vss line) and the third conductive structure 28b serves as a polysilicon landing pad for making further connections. Since the gate structures 22a, 22b and 22c are protected with dielectrics on top and sidewalls, and the third conductive structures 28a and 28b are respectively defined within the nonconductive sidewall dielectrics 24 in a self-aligned approach, the process window in defining the third conductive structures 28a and 28b can be greatly raised. Therefore, the tight design rules in the conventional ETOX (EPROM with Tunnel OXide) process to limit the cell layout are eliminated.

Figure 8:
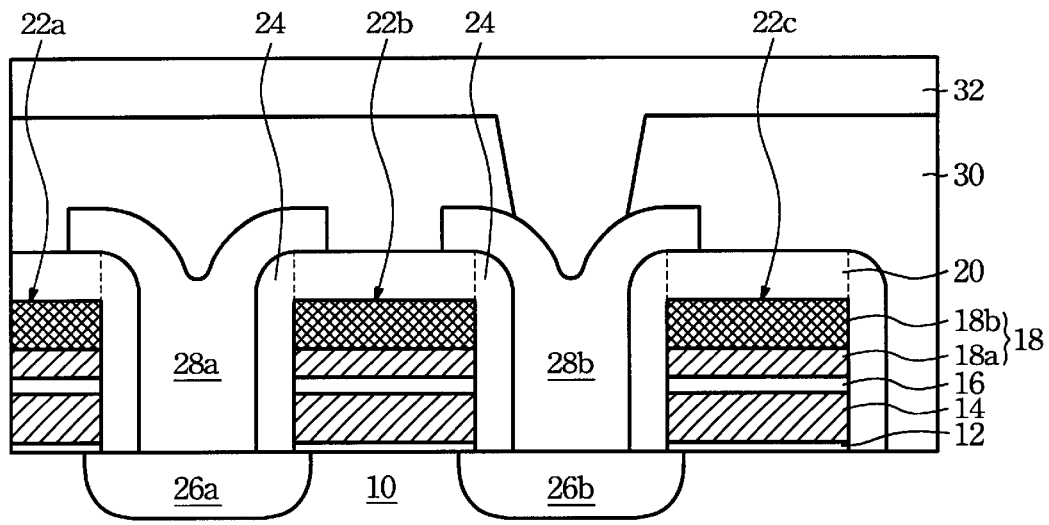
FIG. 8 illustrates a cross sectional view of making contacts to the ETOX cell in accordance with the present invention.

In the preferred embodiments of the present invention, a series of steps can be optionally added to make electrical connections to the cell structure. Referring to FIG. 8, an inter-layer dielectric layer 30 is formed over the substrate 10 to cover the EPROM gate structures 22a, 22b and 22c and the third conductive structures 28a and 28b. The inter-layer dielectric layer 30 is preferably a silicon oxide layer in the case, which can be formed with conventional chemical vapor deposition (CVD) or plasma-enhanced chemical vapor deposition (PECVD) process. A portion of the inter-layer dielectric layer 30 are then removed to define contact openings to a portion of the third conductive structures, such as a contact opening to the conductive structure 28b of landing pad. Finally, an interconnection layer 32 is formed on the inter-layer dielectric layer 30 and within the contact openings in order to electrically couple with the third conductive structure 28b.

Therefore, a cell structure of an electrically programmable read only memory (EPROM) is provided in the present invention. As shown in FIG. 8, the cell structure includes an EPROM gate structure 22b, a source junction region 26a, a drain junction region 26b, a first dielectric layer 20 and 24, a self-aligned common source line 28a, a self-aligned drain contact 28b, a second dielectric layer 30, and a conductive line 32.

The EPROM gate structure 22b is on a portion of the substrate 10. The source junction region 26a is in the substrate 10 located on a first lateral side, namely the left side in the figure, of the EPROM gate structure 22b. The drain junction region 28b is in the substrate 10 located on a second lateral side, namely the right side in the figure, of the EPROM gate structure 22b. The first dielectric layer and 24 covers on top and sidewalls of the EPROM gate structure 22b. The self-aligned common source line 28a neighbors the first dielectric layer 20 and 24 and is above the substrate 10 on a portion of the source junction region 26a. The self-alingned drain contact 28b neighbors the first dielectric layer 20 and 24, and is above the substrate 10 on a portion of the drain junction region 26b. The second dielectric layer 30 covers the first dielectric layer 20 and 24, the self-aligned common source line 28a, and the self-aligned drain contact 28b. The conductive line 32 is on the second dielectric layer 30 and communicates to the self-aligned drain contact 28b.

In the preferred embodiments, the EPROM gate structure 22b includes: a gate oxide layer 12 on a portion of the substrate 10, a floating gate 14 on the gate oxide layer 12, an inter-gate dielectric 16 on the floating gate 14, and a control gate 18 on the inter-gate dielectric 16.

Figure 9:
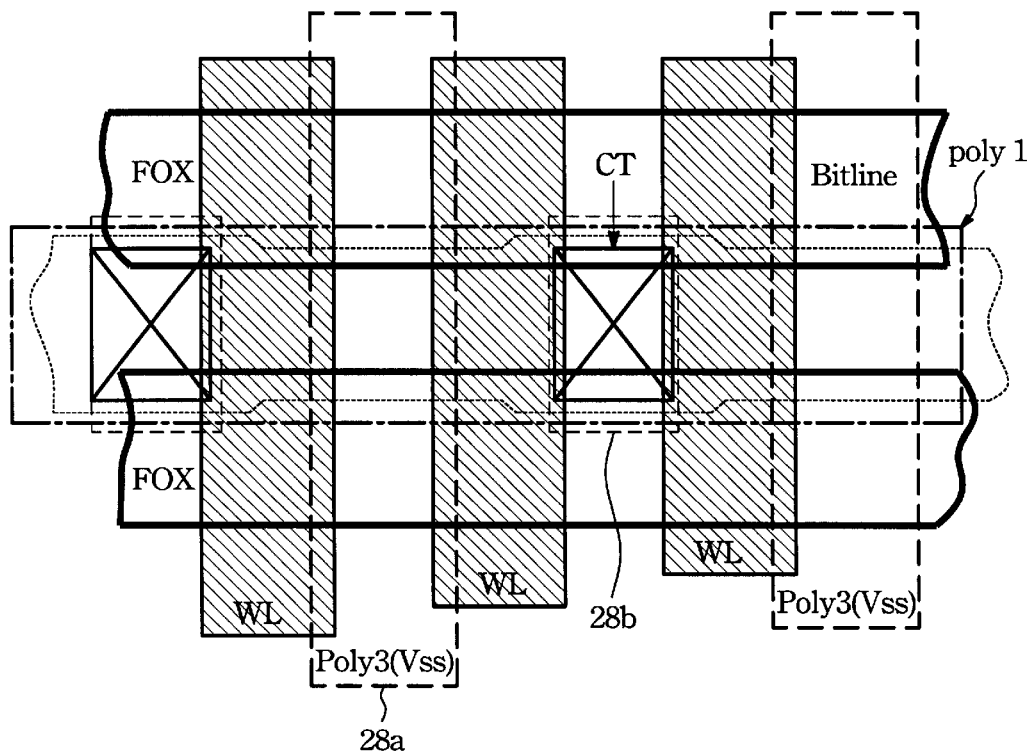
FIG. 9 illustrates a top view of schematic layout of ETOX cells in accordance with the present invention.

Therefore, having the cell structure and the accompanying method in the present invention, the self-aligned common source line 28a is provided to improve the conductivity of the Vss line, and the drain contact 28b is provided in a self-alingned structure and fabrication process, as shown in the schematic top layout view of EPROM cells FIG. 9. The self-aligned common source line 28a with improved conductivity reduces the number of contacts needed and thus reduce the chip area provided for the conventional contacts. The common source line 28a and the drain contact 28 are provided in a self-aligned approach with less reliance on the photo-lithography accuracy. The conventional design rule limitation on the ETOX cell layout is eliminated. The proposed structure provides the ETOX cell with minimized layout area without tighten the process window. The controllability of process and the yield of products are significantly raised.

As is understood by a person skilled in the art, the foregoing descriptions of the preferred embodiment of the present invention is an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A method for forming an electrically programmable read only memory (EPROM) cell on a semiconductor substrate, said method comprising the steps of:

forming a gate insulator layer on said substrate;

forming a first conductive layer on said gate insulator layer;

forming an inter-gate dielectric layer on said first conductive layer;

forming a second conductive layer on said inter-gate dielectric layer;

forming a cap dielectric layer on said second conductive layer;

patterning said cap dielectric layer, said second conductive layer, said inter-gate dielectric layer, said first conductive layer, and said gate insulator layer to form EPROM gate structures;

forming sidewall dielectrics on sidewalls of said EPROM gate structures;

forming source junctions and drain junctions in said substrate under regions between said EPROM gate structures which are uncovered by said EPROM gate structures;

forming a polysilicon layer over said substrate to conformably cover said dielectric sidewalls, said source junctions, said drain junctions, and said cap dielectric layer;

patterning said polysilicon layer to respectively form common source lines on said source junctions and landing pads on said drain junctions;

forming a metal-containing layer over said substrate to cover said polysilicon layer;

performing a thermal process to react said metal-containing layer and said common source lines and said landing pads, in order to form metal silicide structures respectively on said source junctions and said drain junctions; and removing unreacted portions of said metal-containing layer.

2. The method of claim 1 further comprising the steps of:

forming an inter-layer dielectric layer over said substrate covering said EPROM gate structures, said common source lines and said landing pads;

removing a portion of said inter-layer dielectric layer to define contact openings to said landing pads; and forming an interconnection layer on said inter-layer dielectric and within said contact openings in order to electrically couple with said landing pads.

3. The method of claim 1, wherein said gate oxide is thermally grown from said substrate in an oxygen containing ambient, with a thickness between about 50 to 300 angstroms.

4. The method of claim 1, wherein said step of forming said first conductive layer comprises a step of depositing a polysilicon layer by a chemical vapor deposition.

5. The method of claim 1, wherein said inter-gate dielectric layer comprises a tri-layer structure of a first silicon oxide layer, a silicon nitride layer, and a second silicon oxide layer.

6. The method of claim 1, wherein said step of forming said second conductive layer comprises the steps of:

depositing a second polysilicon layer by a chemical vapor deposition on said inter-gate dielectric layer;

forming a metal silicide layer on said second polysilicon layer.

7. The method of claim 1, wherein said cap dielectric layer comprises silicon oxide.

8. The method of claim 1, wherein said metal-containing layer is selected from the group consisting of titanium, titanium nitride, tungsten, cobalt, platinum, nickel, chromium, and the combination thereof.

9. A method for forming an electrically programmable read only memory (EPROM) cell on a semiconductor substrate, said method comprising the steps of:

forming a gate insulator layer on said substrate;

forming a first conductive layer on said gate insulator layer;

forming an inter-gate dielectric layer on said first conductive layer;

forming a second conductive layer on said inter-gate dielectric layer;

forming a cap dielectric layer on said second conductive layer;

patterning said cap dielectric layer, said second conductive layer, said inter gate dielectric layer, said first conductive layer, and said gate insulator layer to form EPROM gate structures;

forming sidewall dielectrics on sidewalls of said EPROM gate structures;

forming source junctions and drain junctions in said substrate under regions between said EPROM gate structures which are uncovered by said EPROM gate structures;

forming a polysilicon layer over said substrate to conformably cover said dielectric sidewalls, said source junctions, said drain junctions, and said cap dielectric layer;

patterning said polysilicon layer to respectively form common source lines on said source junctions and landing pads on said drain junctions;

forming a metal-containing layer over said substrate to cover on said polysilicon layer;

performing a thermal process to react said metal-containing layer and said common source lines and said landing pads, in order to form metal silicide structures respectively on said source junctions and said drain junctions;

removing unreacted portions of said metal-containing layer;

forming an inter-layer dielectric layer over said substrate covering said EPROM gate structures, said common source lines and said landing pads;

removing a portion of said inter-layer dielectric layer to define contact openings to said landing pads; and forming an interconnection layer on said inter-layer dielectric and within said contact openings in order to electrically couple with said landing pads.

10. The method of claim 9, wherein said step of forming said second conductive layer comprises the steps of:

depositing a second polysilicon layer by a chemical vapor deposition on said inter-gate dielectric layer;

forming a metal silicide layer on said second polysilicon layer.

* * * * *